US009627417B2

(12) United States Patent
Lee

(10) Patent No.: US 9,627,417 B2
(45) Date of Patent: Apr. 18, 2017

(54) METHOD OF MANUFACTURING DISPLAY APPARATUS AND DISPLAY APPARATUS MANUFACTURED THROUGH THE METHOD

(71) Applicant: Samsung Display Co., Ltd., Yongin, Gyeonggi-Do (KR)

(72) Inventor: Jaehyun Lee, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/925,644

(22) Filed: Oct. 28, 2015

(65) Prior Publication Data

US 2016/0284733 A1 Sep. 29, 2016

(30) Foreign Application Priority Data

Mar. 27, 2015 (KR) ........................ 10-2015-0043303

(51) Int. Cl.
| | | |
|---|---|---|
| *H01L 27/12* | (2006.01) | |
| *H01L 29/66* | (2006.01) | |
| *H01L 27/32* | (2006.01) | |
| *H01L 29/786* | (2006.01) | |

(52) U.S. Cl.
CPC ........ *H01L 27/124* (2013.01); *H01L 27/1288* (2013.01); *H01L 27/3248* (2013.01); *H01L 27/3262* (2013.01); *H01L 29/66757* (2013.01); *H01L 29/78666* (2013.01); *H01L 29/78675* (2013.01); *H01L 2227/323* (2013.01)

(58) Field of Classification Search
CPC ... H01L 27/12; H01L 27/124; H01L 27/1288; H01L 27/3262; H01L 27/3248
See application file for complete search history.

(56) References Cited

U.S. PATENT DOCUMENTS

| | | | |
|---|---|---|---|
| 5,541,119 | A | 7/1996 | Kodama |
| 2006/0141685 | A1 | 6/2006 | Kim et al. |
| 2014/0167050 | A1 | 6/2014 | Jun et al. |
| 2015/0115257 | A1 | 4/2015 | Lee et al. |
| 2015/0171151 | A1 | 6/2015 | Chae |

FOREIGN PATENT DOCUMENTS

| | | |
|---|---|---|
| JP | 7-28092 A | 1/1995 |
| JP | 2001-94110 A | 4/2001 |
| KR | 10-2006-0075587 A | 7/2006 |
| KR | 10-2014-0077023 A | 6/2014 |

*Primary Examiner* — Douglas Menz
(74) *Attorney, Agent, or Firm* — Robert E. Bushnell, Esq.

(57) ABSTRACT

A method of manufacturing a display apparatus includes: preparing a substrate including a pixel circuit region and a driving circuit region; forming a first active layer at the pixel circuit region; forming a second active layer at the driving circuit region; forming gate electrodes that overlap the first active layer and the second active layer, respectively, with a gate insulating layer disposed therebetween; forming a first insulating layer covering the first and second active layers; forming a first contact hole that passes through the first insulating layer until a portion of the first active layer is exposed; heat-treating the substrate where the first insulating layer, in which the first contact hole is formed, is formed; and forming a second contact hole that passes through the first insulating layer disposed on the heat-treated substrate until a portion of the second active layer is exposed.

11 Claims, 12 Drawing Sheets

METHOD OF MANUFACTURING DISPLAY APPARATUS AND DISPLAY APPARATUS MANUFACTURED THROUGH THE METHOD

CLAIM OF PRIORITY

This application makes to reference to, incorporates into this specification the entire contents of, and claims all benefits accruing under 35 U.S.C. §119 from an application earlier filed in the Korean Intellectual Property Office filed on Mar. 27, 2015 and there duly assigned Serial No. 10-2015-0043303.

BACKGROUND

Field of the Invention

The present invention relates to a method of manufacturing a display apparatus and a display apparatus manufactured through the method.

Description of the Related Art

Recently, the purpose of a display apparatus has diversified. Also, as a display apparatus is thin and lightweight, the display apparatus is widely used, and a demand for implementing a high quality screen has increased.

The display apparatus includes a plurality of circuit portions for providing an image, and respective devices (for example, a thin film transistor, a storage capacitor, etc.) for forming the circuit portions should have different characteristics depending on the function of the circuit portions.

SUMMARY OF THE INVENTION

One or more exemplary embodiments of the invention include a method of manufacturing a display apparatus and a display apparatus manufactured through the method.

Additional aspects will be set forth in part in the description which follows and, in part, will be apparent from the description, or may be learned by practice of the presented embodiments.

According to the present invention, a method of manufacturing a display apparatus includes: preparing a substrate including a pixel circuit region and a driving circuit region; forming a first active layer at the pixel circuit region of the substrate; forming a second active layer at the driving circuit region of the substrate; forming gate electrodes that overlap the first active layer and the second active layer, respectively, with a gate insulating layer disposed therebetween; forming a first insulating layer that covers the first active layer and the second active layer; forming a first contact hole that passes through the first insulating layer until a portion of the first active layer, among the first active layer and the second active layer, is exposed; heat-treating the substrate where the first insulating layer is formed, the first contact hole being formed in the first insulating layer; and forming a second contact hole that passes through the first insulating layer disposed on the heat-treated substrate until a portion of the second active layer is exposed.

The first active layer and the second active layer may be formed during a same mask process, and may include a same material.

Hydrogen concentration of the first active layer, which is adjacent to the first contact hole, may be less than hydrogen concentration of the second active layer, which is adjacent to the second contact hole.

Hydrogen concentration of a first part of the first insulating layer, which is adjacent to the first contact hole, may be less than hydrogen concentration of a second part of the first insulating layer, which is adjacent to the second contact hole.

The gate insulating layer may be disposed between the first and second active layers and the first insulating layer, and each of the first contact hole and the second contact hole may pass through the gate insulating layer and the first insulating layer.

Hydrogen concentration of a first part of the gate insulating layer, which is adjacent to the first contact hole, may be less than hydrogen concentration of a second part of the gate insulating layer, which is adjacent to the second contact hole.

The method may further include doping the first active layer and the second active layer with the same impurities.

According to the present invention, a display apparatus includes: a substrate including a pixel circuit region and a driving circuit region; a first thin film transistor formed at the pixel circuit region of the substrate and including a first active layer, a first gate electrode, a first source electrode, and a first drain electrode; a display device connected to one of the first source electrode and the first drain electrode; a second thin film transistor formed at the driving circuit region of the substrate and including a second active layer, a second gate electrode, a second source electrode, and a second drain electrode; and a first insulating layer covering the first active layer and the second active layer, the first insulating layer including a first contact hole that exposes a portion of the first active layer, and a second contact hole that exposes a portion of the second active layer, the first active layer and the second active layer including a same material, and the hydrogen concentration of a first part of the first active layer that is adjacent to the first contact hole being less than hydrogen concentration of a second part of the second active layer that is adjacent to the second contact hole.

Hydrogen concentration of a first part of the first insulating layer, which is adjacent to the first contact hole, may be less than hydrogen concentration of a second part of the first insulating layer, which is adjacent to the second contact hole.

The display apparatus may further include a gate insulating layer disposed between the first and second active layers and the first insulating layer, and each of the first contact hole and the second contact hole may pass through the gate insulating layer and the first insulating layer.

Hydrogen concentration of a first part of the gate insulating layer, which is adjacent to the first contact hole, may be less than hydrogen concentration of a second part of the gate insulating layer, which is adjacent to the second contact hole.

The first active layer may include a source region and a drain region doped with first impurities, the second active layer may include a source region and a drain region doped with second impurities, and the first impurities and the second impurities may be a same material.

A method of manufacturing a display apparatus and a display apparatus manufactured via the method according to an exemplary embodiment may increase response speeds that respond to high speed driving and may provide a screen of various gray scales.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
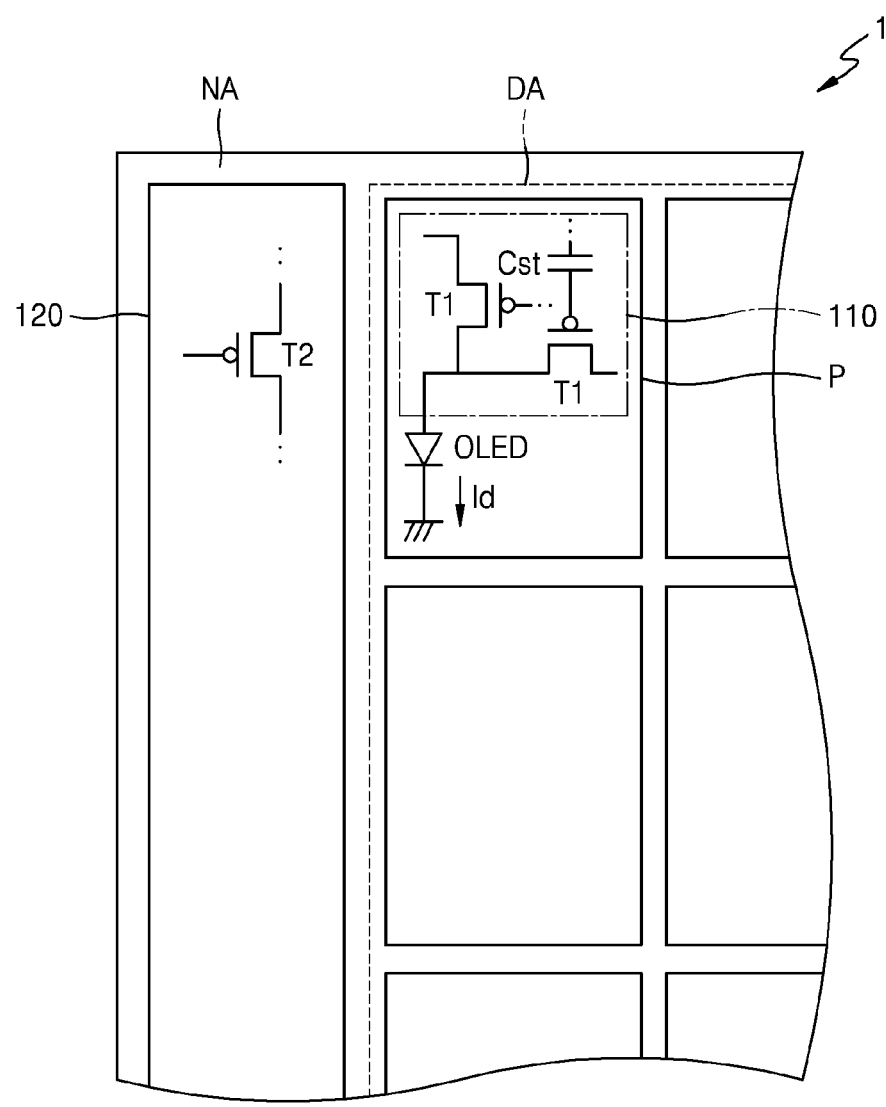
FIG. 1 is a plan view illustrating a display apparatus according to an exemplary embodiment of the invention.

As the present invention allows for various changes and numerous embodiments, exemplary embodiments will be illustrated in the drawings and described in detail in the written description. An effect and a characteristic of the present invention, and a method for accomplishing these will be apparent when exemplary embodiments described below in detail are referred to together with the drawings. However, the present invention is not limited to exemplary embodiments described below and may be implemented in various forms.

As used herein, the term "and/or" includes any and all combinations of one or more of the associated listed items.

Hereinafter, exemplary embodiments are described in detail with reference to the accompanying drawings Like reference numerals are used for like or corresponding elements when description is made with reference to the drawings, and repeated description thereof is omitted.

It will be understood that, although the terms "first", "second", etc. may be used herein to describe various components, these components should not be limited by these terms. These terms are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that, when a layer, region or component is referred to as being "formed on," another layer, region or component, it can be directly or indirectly formed on the other layer, region or component. That is, for example, intervening layers, regions or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

Also, it will be understood that, when a layer, region or component is referred to as being "connected" to another layer, region or component, it may be "directly connected" to the other layer, region or component, or it may be "indirectly connected" to the other layer, region or component with another layer, region or component disposed therebetween. For example, it will be understood that, when a layer, region or component is referred to as being "electrically connected" to another layer, region or component, it may be "directly electrically connected" to the other layer, region or component, or it may be "indirectly electrically connected" to the other layer, region or component with another layer, region or component disposed therebetween.

FIG. 1 is a plan view illustrating a display apparatus 1 according to an exemplary embodiment of the present invention.

Referring to FIG. 1, the display apparatus 1 includes a display area DA where a plurality of pixels are formed, and a non-display area NA that is adjacent to the display area DA.

The display area DA is an area where a plurality of pixels are formed, and an image may be displayed on the display area DA. A pixel circuit portion 110 for controlling a driving current flowing through a display such as an organic light-emitting device (OLED) that emits light, is formed in each pixel P. The pixel circuit portion 110 may include wirings, a thin film transistor (TFT) T1, and a storage capacitor Cst connected to the wirings. According to an embodiment, some TFTs T1 formed in the pixel circuit portion 110 may be driving TFTs and the others may be switching TFTs, but the present invention is not limited thereto.

The non-display area NA is an area where an image is not displayed. A driving circuit portion 120 for driving the pixel circuit portion 110 formed in each pixel P of the display area DA is formed in the non-display area NA. The driving circuit portion 120 may include wirings and a TFT T2 connected to the wirings, and provide an electric signal to the pixel circuit portion 110 formed in each pixel P.

The TFT T1 (referred to as a first TFT) included in the pixel circuit portion 110 and the TFT T2 (referred to as a second TFT) included in the driving circuit portion 120 require different characteristics. A gray scale displayed by a pixel P is determined by a current transferred to an OLED, for example, a drain current $I_d$ of the first TFT T1. To increase a voltage margin for gray scale expression of the OLED, and thus express a gray scale in abundance, an I-V curve of the first TFT T1 has a gentle slope before a threshold voltage.

Since the driving circuit portion 120 has to drive a plurality of pixels P, it has to operate at a high speed. Also, since the driving circuit portion 120 plays a role of controlling a signal applied to each pixel circuit portion 110, an on/off characteristic is important. For example, in the case where an I-V curve of the second TFT T2 has a gentle slope before a threshold voltage, the on/off characteristic deteriorates, so that it becomes impossible to perform a high speed operation, and a delay of a signal applied to each pixel circuit portion 110 may occur. Therefore, the second TFT T2 needs to have a characteristic that is different from that of the first TFT T1, for example, an I-V curve of the second TFT T2 needs to have a steep slope before the threshold voltage.

Different characteristics of the first TFT T1 and the second TFT T2 are required, but the first TFT T1 and the second TFT T2 are formed via the same mask processes during a manufacturing process of the display apparatus 1, and thus, it is difficult for the first and second TFTs T1 and T2, respectively, to have different characteristics. However, according to exemplary embodiments, it is possible to manufacture the first TFT T1 and the second TFT T2 via the same mask processes and have different characteristics.

FIGS. 2 to 8 are cross-sectional views illustrating a method of manufacturing a display apparatus according to an exemplary embodiment.

Figure 2:
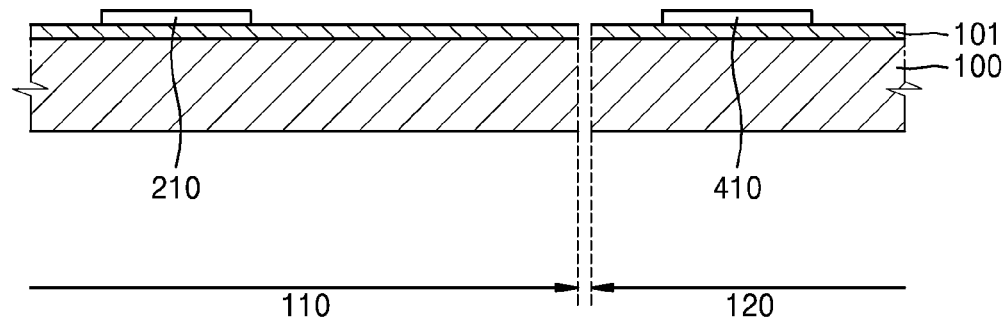
FIGS. 2 to 8 are cross-sectional views illustrating a method of manufacturing a display apparatus, according to an exemplary embodiment of the invention.

FIG. 2 illustrates a first mask process.

Referring to FIG. 2, a substrate 100 including a pixel circuit region corresponding to the pixel circuit portion 110 and a driving circuit region corresponding to the driving circuit portion 120 is prepared, a semiconductor layer (not shown) is formed on the substrate 100, and then a first active layer 210 and a second active layer 410 are formed in the pixel circuit portion 110 and the driving circuit portion 120, respectively, by patterning the semiconductor layer.

The substrate 100 may be formed of a metal material, or a plastic material such as polyethylene terephthalate (PET), polyethylene naphthalate (PEN), polyimide, etc. In the case where the substrate 100 is formed of a plastic material or a metal material, the substrate 100 may have flexibility. A buffer layer 101 may be provided on the substrate 100, wherein the buffer layer 101 is formed of $SiO_2$ and/or SiNx, etc., for preventing impurities from penetrating into the substrate 100. The buffer layer 101 may be deposited by using various deposition methods such as a plasma-enhanced chemical vapor deposition (PECVD) method, an atmospheric pressure CVD (APCVD) method, a low pressure CVD (LPCVD) method, etc.

The first active layer 210 formed in the pixel circuit portion 110 and the second active layer 410 formed in the driving circuit portion 120 are simultaneously formed during the same mask process. The first active layer 210 is formed of the same material as the second active layer 410. For example, the first active layer 210 and the second active layer 410 may be formed of a semiconductor including amorphous silicon or polysilicon.

According to an embodiment, polysilicon may be formed by crystallizing amorphous silicon, but the invention is not limited thereto. As a crystallizing method, various methods such as a rapid thermal annealing (RTA) method, a solid phase crystallization (SPC) method, a metal-induced crystallization (MIC) method, a metal-induced lateral crystallization (MILC) method, a sequential lateral solidification (SLS) method, etc. may be applied.

Figure 3:
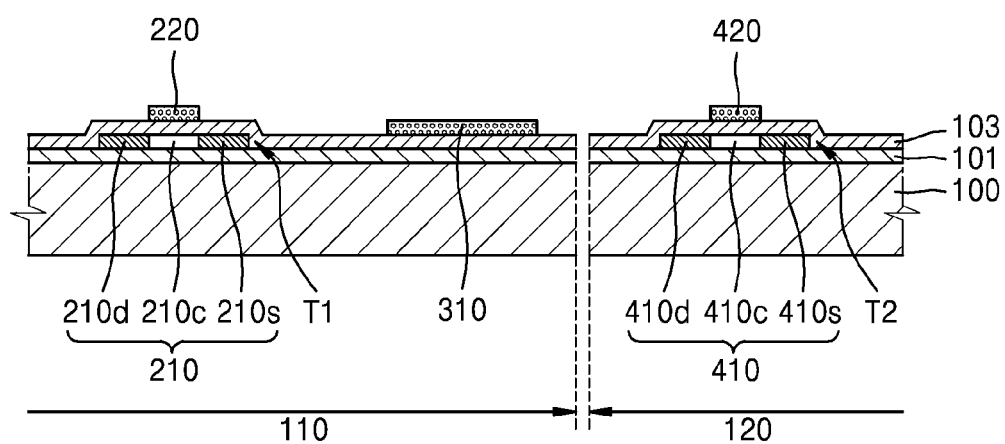

FIG. 3 illustrates a second mask process.

Referring to FIG. 3, a gate insulating layer 103 is formed on the substrate 100, a first metal layer (not shown) is formed, and then gate electrodes 220 and 420 are formed in the pixel circuit portion 110 and the driving circuit portion 120, respectively, by patterning the first metal layer. While the first metal layer is patterned, a first electrode 310 of a storage capacitor may be formed in the pixel circuit portion 110 on the same layer where the gate electrode 220 is disposed.

The gate insulating layer 103 may be formed of $SiO_2$ and/or $SiN_x$. The gate insulating layer 103 may be formed by a deposition method such as a PECVD method, an APCVD method, an LPCVD method, etc.

After that, the first active layer 210 and the second active layer 410 are doped with impurities by using the gate electrodes 220 and 420, respectively, as a self-aligned mask.

The first active layer 210 and the second active layer 410 may be doped during the same doping process, and first impurities used for doping the first active layer 210 may be the same material as second impurities used for doping the second active layer 410.

Figure 4:
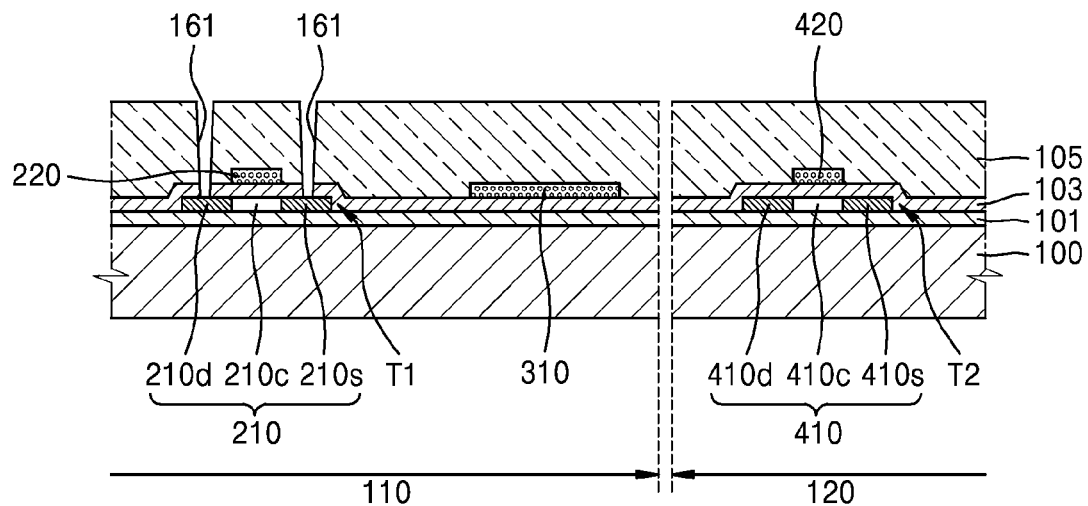

FIG. 4 illustrates a third mask process.

Referring to FIG. 4, a first insulating layer 105 is formed on the substrate 100, on which the gate electrodes 220 and 420 are formed, and a first contact hole 161 is formed. The first contact hole 161 is formed in only the pixel circuit portion 110 among the pixel circuit portion 110 and the driving circuit portion 120.

The first insulating layer 105 is an inter-layer insulating layer and may be formed of $SiO_2$ and/or $SiN_x$ as a single layer or layers. The first insulating layer 105 may be formed by using a deposition method such as a PECVD method, an APCVD method, an LPCVD method, etc. The first contact hole 161 formed in the first insulating layer 105 may expose a portion of the first active layer 210 formed in the pixel circuit portion 110, for example, a portion of an upper surface of the first active layer 210.

Figure 5:
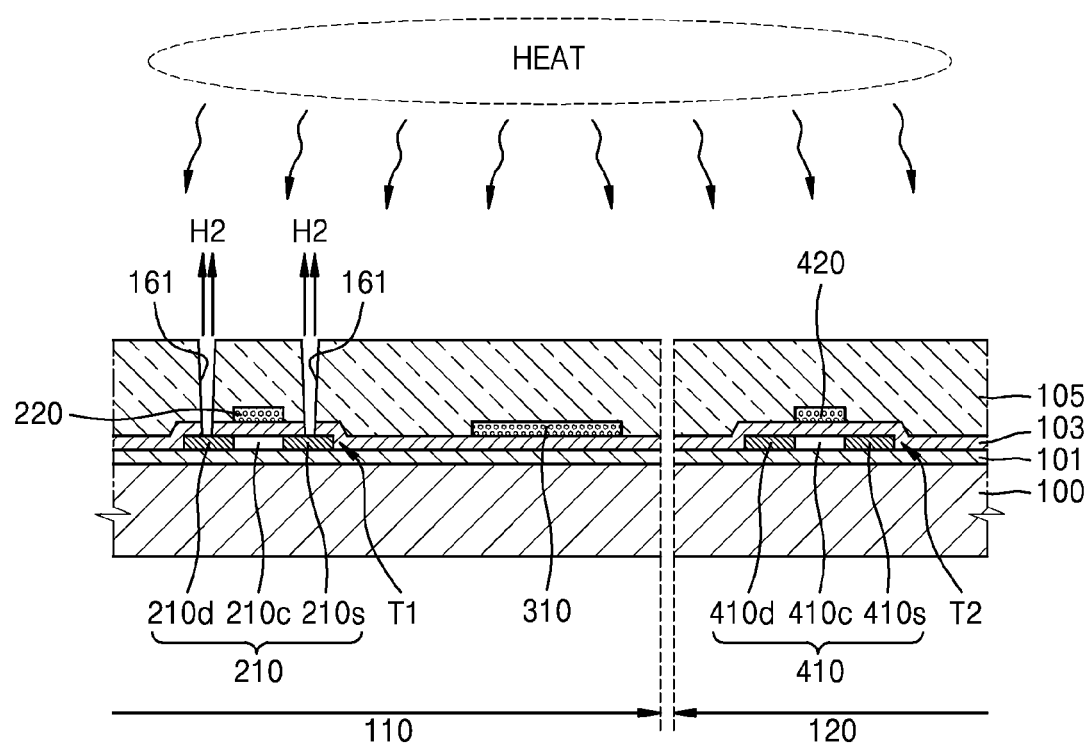

FIG. 5 illustrates a heat treatment process.

Referring to FIG. 5, the substrate 100, on which the first insulating layer 105 having the first contact hole 161 is disposed, is heat-treated.

As heat is applied to the substrate 100, hydrogen contained in the gate insulating layer 103 and the first insulating layer 105 that are formed of $SiO_2$ and/or $SiN_x$ may combine with a dangling bond of the first and second active layers 210 and 410, respectively, to remove a defect site existing in each of the first active layer 210 and the second active layer 410, and thus to improve the characteristics of the first and second TFTs T1 and T2, respectively.

Since the heat treatment process is performed with the first contact hole 161 exposing the upper portion of the first active layer 210, a portion of hydrogen contained in the first active layer 210 may evaporate. For example, the first active layer 210, formed of amorphous silicon, is formed by using a silicon source gas such as silane, and the silicon source gas is deposited in a state of Si—H or Si—$H_2$ so that the amorphous silicon contains much hydrogen. As another exemplary embodiment, the first active layer 210, formed of polysilicon, may be formed by crystallizing amorphous silicon. The polysilicon also contains hydrogen although the amount of hydrogen contained in the polysilicon is small compared with the amount of hydrogen contained in amorphous silicon since hydrogen in the polysilicon evaporates during the crystallization process.

Since the first active layer 210 is exposed via the first contact hole 161, a portion of hydrogen contained in the first active layer 210 evaporates via the first contact hole 161 during the heat treatment process. Conversely, since the second active layer 410 is covered with the gate insulating layer 103 and the first insulating layer 105, it is difficult for hydrogen contained in the second active layer 410 to escape to the outside. Therefore, due to the heat treatment process, the hydrogen concentration of the first active layer 210 becomes lower than the hydrogen concentration of the second active layer 410.

Since the heat treatment process is performed after the first contact hole 161 is formed through the gate insulating layer 103 and the first insulating layer 105 formed of $SiO_2$ and/or $SiN_x$, a portion of hydrogen contained in the gate insulating layer 103 and the first insulating layer 105 may evaporate via the first contact hole 161. In this case, parts of the gate insulating layer 103 and the first insulating layer 105 that are adjacent to the first contact hole 161 may have low hydrogen concentration compared with other parts (regions).

Figure 6:
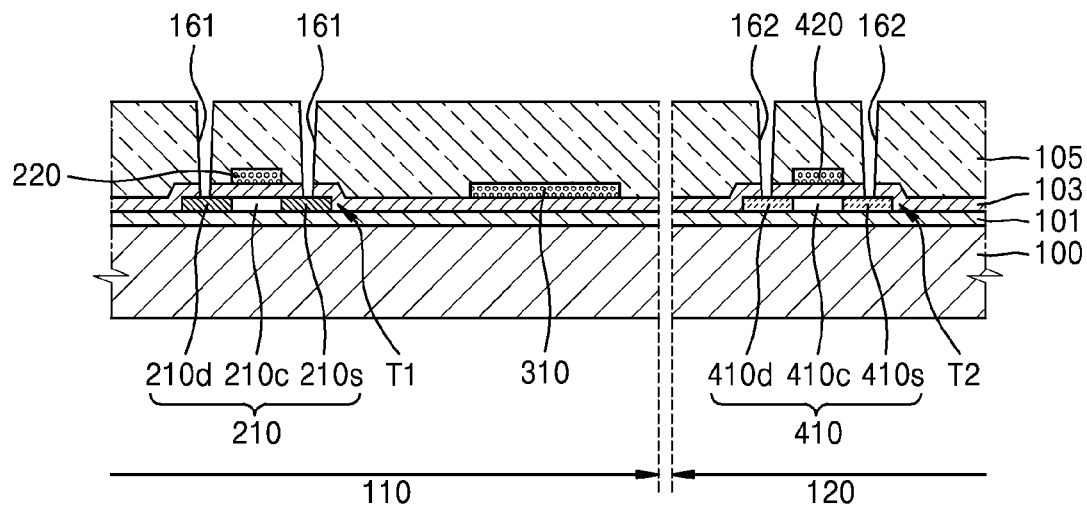

FIG. 6 illustrates a fourth mask process.

Referring to FIG. 6, a second contact hole 162 is formed in the first insulating layer 105. The second contact hole 162 exposes a portion of the second active layer 410 formed in the driving circuit portion 120, for example, a portion of an upper surface of the second active layer 410.

Figure 7:
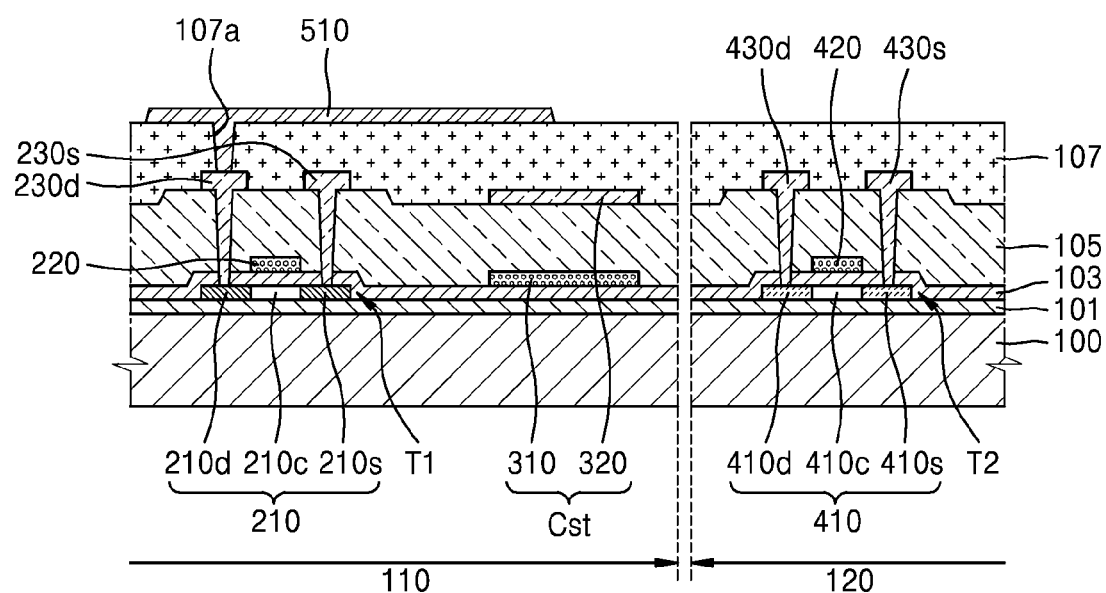

FIG. 7 illustrates fifth to seventh mask processes.

Referring to FIG. 7, a second metal layer (not shown) is formed on the first insulating layer 105 in which the first contact hole 161 and the second contact hole 162 are formed, and then a first source electrode 230s, a first drain electrode 230d, a second source electrode 430s and a second drain electrode 430d are formed by patterning the second metal layer (the fifth mask process). While the second metal layer is patterned, a second electrode 320 of the storage capacitor Cst, disposed on the same layer where the first source electrode 230s and the first drain electrode 230d are disposed, may be formed in the pixel circuit portion 110.

Then, after a second insulating layer 107, which is a planarization layer, is formed, a hole 107a that exposes one of the first source electrode 230s and the first drain electrode 230d is formed (the sixth mask process) in the second insulating layer 107. Next, an electrode layer (not shown) is formed on the second insulating layer 107, and a pixel electrode 510 is formed by patterning the electrode layer (the seventh mask process).

Figure 8:
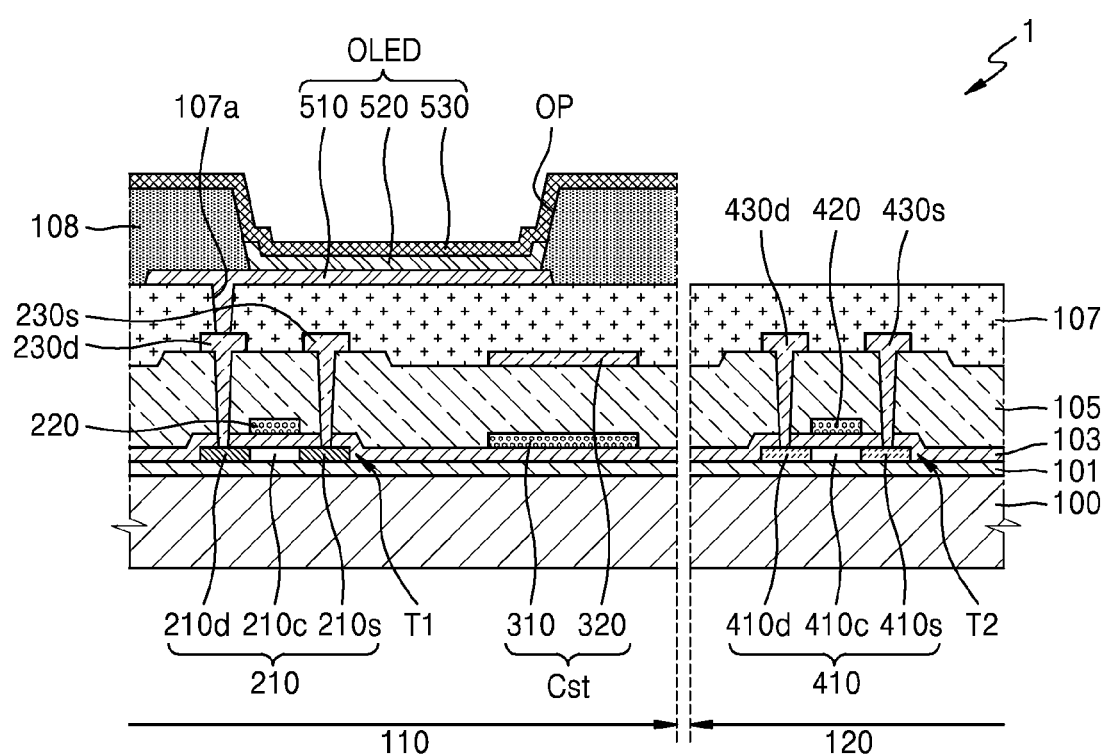

FIG. 8 illustrates a process of forming an OLED.

Referring to FIG. 8, after formation of a pixel-defining layer 108 having an opening OP that exposes the pixel electrode 510, an interlayer 520, including an emission layer, and an opposite electrode 530 are sequentially formed on a portion of the pixel electrode 510 that is exposed via the opening OP.

Although a case where the OLED is formed in the pixel circuit portion 110 of FIG. 8 has been illustrated according to an exemplary embodiment, the present invention is not limited to that exemplary embodiment. As another exemplary embodiment, a liquid crystal display device may be formed in the pixel circuit portion 110 so that the display apparatus 1 may become a liquid crystal display apparatus.

In the display apparatus 1 manufactured according to the method described with reference to FIGS. 2 to 8, the first TFT T1 of the pixel circuit portion 110 and an adjacent portion thereof are different from the second TFT T2 of the driving circuit portion 120 and an adjacent portion thereof.

Figure 9A:
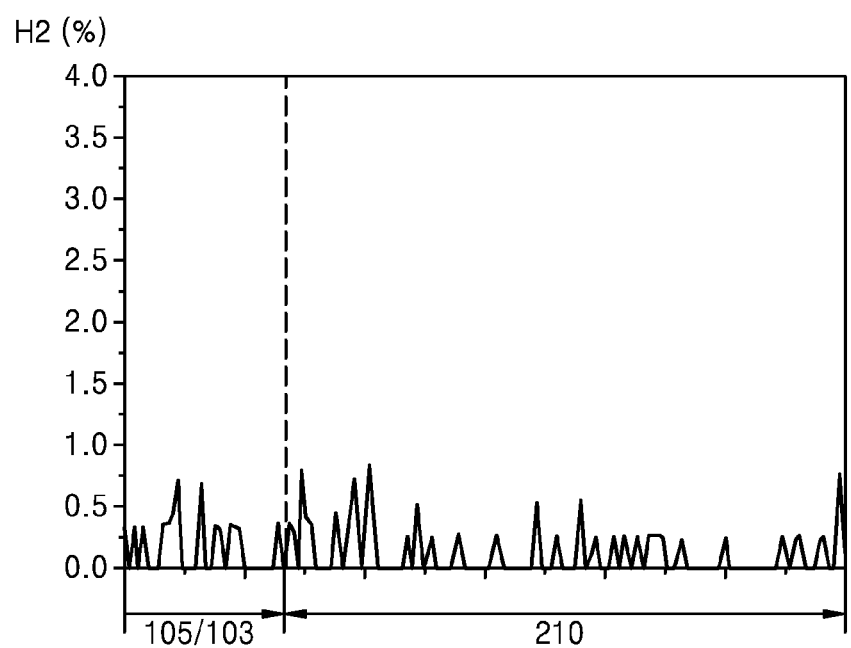
FIG. 9A is a graph illustrating hydrogen content of a first insulating layer, a gate insulating layer, and a first active layer that are adjacent to a first contact hole.
Figure 9B:
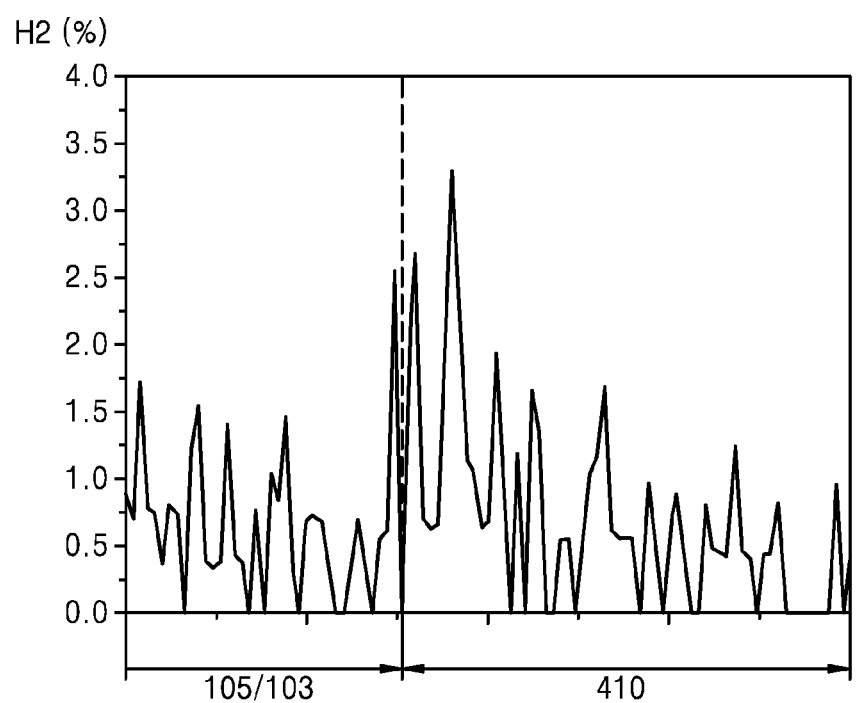
FIG. 9B is a graph illustrating hydrogen content of a first insulating layer, a gate insulating layer, and a second active layer that are adjacent to a second contact hole.

FIG. 9A is a graph illustrating hydrogen content of a first insulating layer, a gate insulating layer, and a first active layer that are adjacent to a first contact hole, and FIG. 9B is a graph illustrating hydrogen content of a first insulating layer, a gate insulating layer, and a second active layer that are adjacent to a second contact hole.

Referring to FIGS. 9A and 9B, the hydrogen concentration of the first active layer 210 is lower than the hydrogen concentration of the second active layer 410. As described with reference to FIG. 5, since a portion of hydrogen contained in the first active layer 210 evaporates via the first contact hole 161 during the heat treatment process, the hydrogen concentration of the first active layer 210 is lower than the hydrogen concentration of the second active layer 410.

Referring to FIGS. 9A and 9B, the hydrogen concentration of parts of the first insulating layer 105 that is adjacent to the first contact hole 161 and/or the gate insulating layer 103 that is adjacent to the first contact hole 161 is lower than the hydrogen concentration of parts of the first insulating layer 105 that is adjacent to the second contact hole 162 and/or the gate insulating layer 103 that is adjacent to the second contact hole 162. This is because not only hydrogen contained in the first active layer 210 but also hydrogen contained in the first insulating layer 105 and/or the gate insulting layer 103 evaporates via the first contact hole 161 during the heat treatment process described with reference to FIG. 5.

Figure 10:
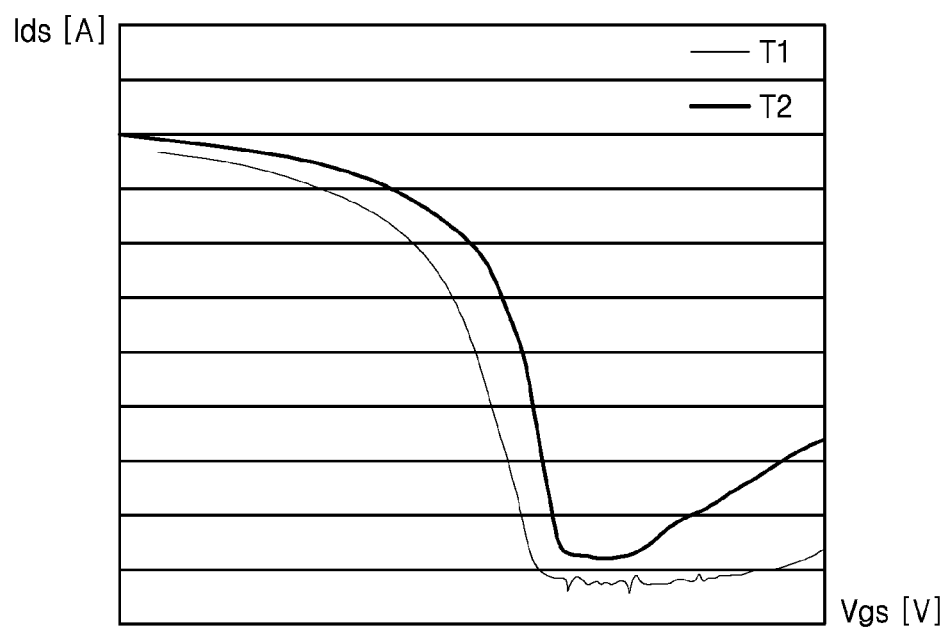
FIG. 10 is an I-V curve of a first thin film transistor of a pixel circuit portion and a second thin film transistor of a driving circuit portion.

FIG. 10 is an I-V curve of a first thin film transistor of a pixel circuit portion and a second thin film transistor of a driving circuit portion.

Referring to FIG. 10, the first TFT T1 of the pixel circuit portion 110 has a gentle slope before a threshold voltage and the second TFT T2 of the driving circuit portion 120 has a steep slope before the threshold voltage. The first TFT T1 may express a gray scale in abundance because a voltage margin Vgs for expressing a gray scale of the OLED increases, and the second TFT T2 improves in its on/off characteristic and thus may operate at a high speed.

The position of the storage capacitor Cst of the pixel circuit portion 110 described with reference to FIGS. 2 to 8 is not limited to the illustration. As another exemplary embodiment, the storage capacitor Cst may overlap one of first TFTs T1 formed in the pixel circuit portion 110. In this case, the gate electrode 220 of the first TFT T1 may also serve as the function of the first electrode 310 of the storage capacitor Cst.

Although a top gate type TFT has been described using the first and second TFTs T1 and T2, respectively, with reference to FIGS. 2 to 8 in the foregoing, the invention is not limited to that exemplary embodiment. As another exemplary embodiment, the first and second TFTs T1 and T2, respectively, may be bottom gate type TFTs,.

Figure 11:
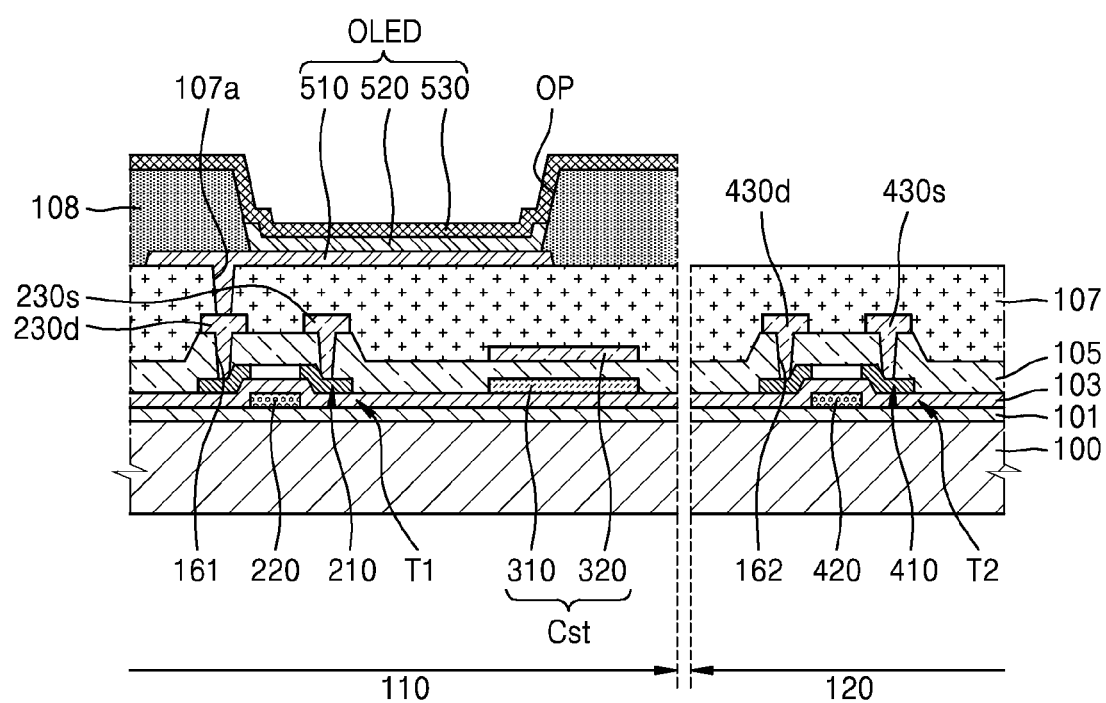
FIG. 11 is a cross-sectional view illustrating a display apparatus according to another exemplary embodiment of the invention.

FIG. 11 is a cross-sectional view illustrating a display apparatus according to another exemplary embodiment.

Specifically, FIG. 11 is a cross-sectional view illustrating a display apparatus whose first and second TFTs T1 and T2, respectively, are bottom gate type TFTs.

Referring to FIG. 11, the display apparatus is the same as the above-described display apparatus except that the first and second TFTs T1 and T2, respectively, are bottom gate type TFTs. The only difference is a sequence of processes of forming the gate electrode 220, the gate insulating layer 103, and the first and second active layers 210 and 410, respectively. Specifically, the bottom gate type first and second TFTs T1 and T2, respectively, are different from the above-described top gate type first and second TFTs T1 and T2,respectively, in that the gate electrodes 220 and 420 are formed via a first mask process, the gate insulating layer 103 is formed, and then the first and second active layers 210 and 410, respectively, are formed during a second mask process.

Even in the display apparatus of FIG. 11, the first contact hole 161 that exposes the first active layer 210 is formed, heat treatment is performed, and then the second contact hole 162 that exposes the second active layer 410 is formed as described above.

Through these processes, the hydrogen concentration of the first active layer 210 becomes lower than the hydrogen concentration of the second active layer 410. Since a portion of hydrogen contained in the first active layer 210 evaporates via the first contact hole 161, the hydrogen concentration of the first active layer 210 becomes lower than the hydrogen concentration of the second active layer 410. Also, the hydrogen concentration of a part of the first insulating layer 105 that is adjacent to the first contact hole 161 is lower than the hydrogen concentration of a part of the first insulating layer 105 that is adjacent to the second contact hole 162. This is because not only hydrogen contained in the first active layer 210 but also hydrogen contained in the first insulating layer 105 evaporates via the first contact hole 161.

The bottom gate type first and second TFTs T1 and T2, respectively, have the different characteristics described above with reference to FIG. 10 due to a difference in hydrogen concentration.

While various exemplary embodiments have been described with reference to the figures, it will be understood by those of ordinary skill in the art that various changes in form and detail may be made therein without departing from the spirit and scope as defined by the following claims.

What is claimed is:

1. A method of manufacturing a display apparatus, the method comprising the steps of:
   preparing a substrate including a pixel circuit region and a driving circuit region;
   forming a first active layer at the pixel circuit region of the substrate;
   forming a second active layer at the driving circuit region of the substrate;
   forming gate electrodes that overlap the first active layer and the second active layer, respectively, with a gate insulating layer disposed therebetween;
   forming a first insulating layer on the substrate so as to cover the first active layer and the second active layer;
   forming a first contact hole that passes through the first insulating layer until a portion of the first active layer, among the first active layer and the second active layer, is exposed;
   heat-treating the substrate where the first insulating layer, having the first contact hole passing through it, is formed; and
   forming a second contact hole that passes through the first insulating layer disposed on the heat-treated substrate until a portion of the second active layer is exposed;
   wherein the first active layer and the second active layer are formed during a same mask process and comprise a same material, and wherein a hydrogen concentration of the first active layer that is adjacent to the first contact hole is less than a hydrogen concentration of the second active layer that is adjacent to the second contact hole.

2. The method of claim 1, wherein a hydrogen concentration of a first part of the first insulating layer that is adjacent to the first contact hole is less than a hydrogen concentration of a second part of the first insulating layer that is adjacent to the second contact hole.

3. The method of claim 1, wherein:
   the gate insulating layer is disposed between the first and second active layers and the first insulating layer; and
   each of the first contact hole and the second contact hole passes through the gate insulating layer and the first insulating layer.

4. The method of claim 3, wherein a hydrogen concentration of a first part of the gate insulating layer that is adjacent to the first contact hole is less than a hydrogen concentration of a second part of the gate insulating layer that is adjacent to the second contact hole.

5. The method of claim 1, further comprising the step of doping the first active layer and the second active layer with same impurities.

6. A display apparatus, comprising:
   a substrate including a pixel circuit region and a driving circuit region;
   a first thin film transistor disposed in the pixel circuit region of the substrate and comprising a first active layer, a first gate electrode, a first source electrode, and a first drain electrode;
   a display device connected to one of the first source electrode and the first drain electrode;
   a second thin film transistor disposed in the driving circuit region of the substrate and comprising a second active layer, a second gate electrode, a second source electrode, and a second drain electrode; and
   a first insulating layer covering the first active layer and the second active layer;
   wherein the first insulating layer includes a first contact hole that exposes a portion of the first active layer, and a second contact hole that exposes a portion of the second active layer; and
   wherein the first active layer and the second active layer comprise a same material, and a hydrogen concentration of a first part of the first active layer that is adjacent to the first contact hole is less than a hydrogen concentration of a second part of the second active layer that is adjacent to the second contact hole.

7. The apparatus of claim 6, wherein a hydrogen concentration of a first part of the first insulating layer that is adjacent to the first contact hole is less than a hydrogen concentration of a second part of the first insulating layer that is adjacent to the second contact hole.

8. The apparatus of claim 6, further comprising:
   a gate insulating layer disposed between the first and second active layers and the first insulating layer;
   wherein each of the first contact hole and the second contact hole passes through the gate insulating layer and the first insulating layer.

9. The apparatus of claim 8, wherein a hydrogen concentration of a first part of the gate insulating layer that is adjacent to the first contact hole is less than a hydrogen concentration of a second part of the gate insulating layer that is adjacent to the second contact hole.

10. The apparatus of claim 6, wherein:
    the first active layer includes a source region and a drain region doped with first impurities,
    the second active layer includes a source region and a drain region doped with second impurities, and
    the first impurities are of same materials as the second impurities.

11. The apparatus of claim 6, further comprising the first active layer and the second active layer doped with the same impurities.

* * * * *